US009627175B2

United States Patent
Morita et al.

(10) Patent No.: US 9,627,175 B2
(45) Date of Patent: Apr. 18, 2017

(54) ELECTRON MICROSCOPE AND ELEMENTAL MAPPING IMAGE GENERATION METHOD

(71) Applicant: JEOL Ltd., Tokyo (JP)

(72) Inventors: Masaki Morita, Tokyo (JP); Akira Yasuhara, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 14/882,817

(22) Filed: Oct. 14, 2015

(65) Prior Publication Data

US 2016/0111248 A1    Apr. 21, 2016

(30) Foreign Application Priority Data

Oct. 17, 2014  (JP) .................. 2014-212842
Jul. 24, 2015  (JP) .................. 2015-146985

(51) Int. Cl.
*H01J 37/28*  (2006.01)
*H01J 37/22*  (2006.01)

(52) U.S. Cl.
CPC ............ *H01J 37/222* (2013.01); *H01J 37/28* (2013.01); *H01J 2237/221* (2013.01); *H01J 2237/2442* (2013.01); *H01J 2237/24585* (2013.01); *H01J 2237/2802* (2013.01)

(58) Field of Classification Search
CPC .... H01J 37/222; H01J 37/28; H01J 2237/221; H01J 2237/2801; H01J 2237/2802
See application file for complete search history.

(56) References Cited

U.S. PATENT DOCUMENTS

| 2011/0144922 A1* | 6/2011 | Corbett ............... H01J 37/28 702/28 |
| 2011/0220796 A1* | 9/2011 | Nicolopoulos .. G01N 23/20058 250/307 |
| 2011/0266439 A1* | 11/2011 | Luecken ............ H01J 37/244 250/307 |
| 2011/0301869 A1* | 12/2011 | Gottlieb ............ G01N 23/2206 702/32 |
| 2013/0015351 A1* | 1/2013 | Kooijman .......... G01N 23/2206 250/307 |
| 2013/0037715 A1* | 2/2013 | Boughorbel ......... H01J 37/222 250/307 |
| 2014/0319344 A1* | 10/2014 | Miller ................... G06T 7/0042 250/307 |
| 2015/0115155 A1* | 4/2015 | Yamazaki ............ H01J 37/28 250/307 |
| 2015/0270094 A1* | 9/2015 | Ikku ..................... H01J 37/28 250/307 |

(Continued)

FOREIGN PATENT DOCUMENTS

JP           20037245 A      1/2003

*Primary Examiner* — Wyatt Stoffa
(74) *Attorney, Agent, or Firm* — The Webb Law Firm

(57) ABSTRACT

An electron microscope includes an acquisition section that acquires an electron microscope image of a specimen that includes a plurality of identical patterns, and a spectrum at each pixel of the electron microscope image, and an elemental map generation section that adds up the spectrum at each pixel of each of a plurality of areas that are included in the electron microscope image and have an identical size to generate an elemental mapping image of the specimen.

5 Claims, 11 Drawing Sheets

(56) References Cited

U.S. PATENT DOCUMENTS

2015/0279616 A1* 10/2015 Jiruse .................. G01J 3/44
 850/9
2016/0013015 A1* 1/2016 Potocek .............. G02B 21/002
 250/307

\* cited by examiner

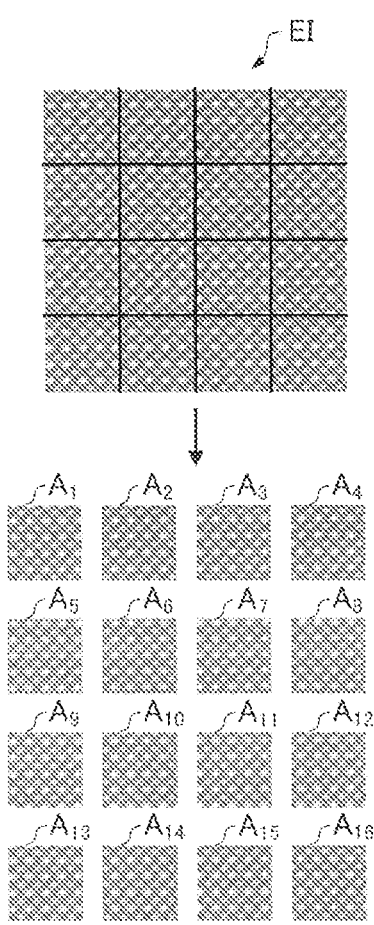

FIG.4A
| AREA | $\Delta x_n$ | $\Delta y_n$ |
|---|---|---|
| $A_2$ | 1 | 1 |
| $A_3$ | 0 | 1 |
| $A_{16}$ | −1 | 1 |
FIG.4B
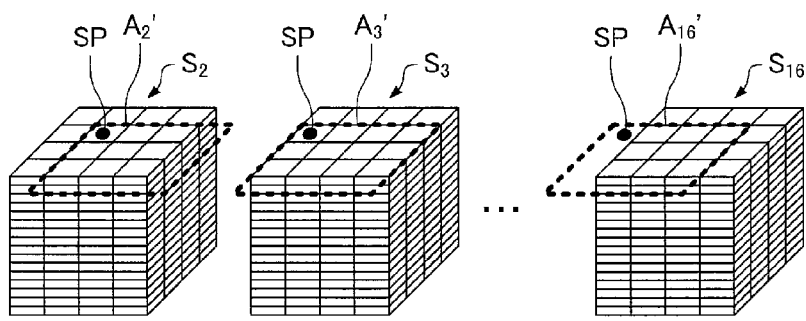
FIG.4C
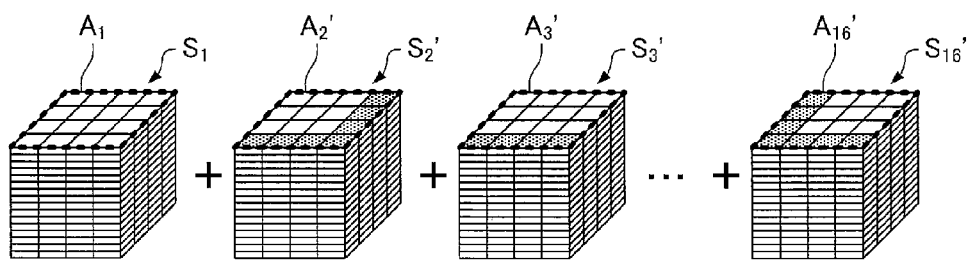

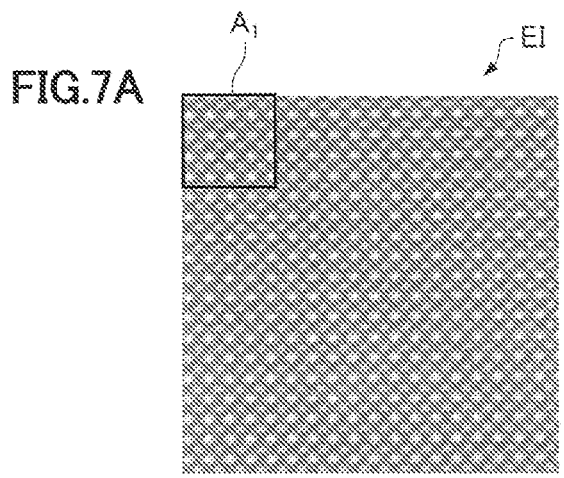
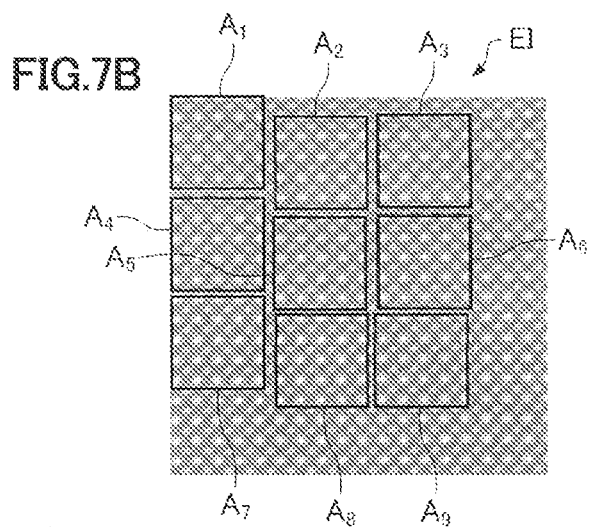
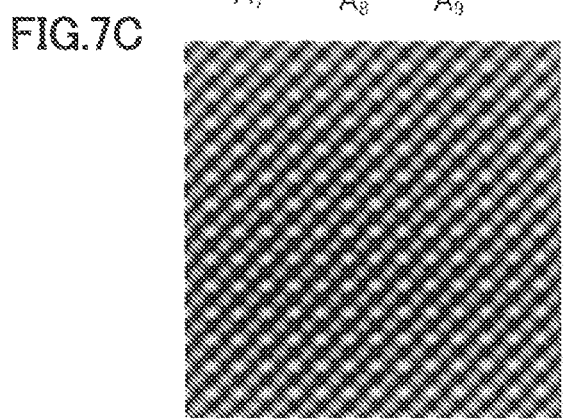

ELECTRON MICROSCOPE AND ELEMENTAL MAPPING IMAGE GENERATION METHOD

Japanese Patent Application No. 2014-212842, filed on Oct. 17, 2014, and Japanese Patent Application No. 2015-146985 filed on Jul. 24, 2015, are hereby incorporated by reference in its entirety.

BACKGROUND OF THE INVENTION

The present invention relates to an electron microscope and an elemental mapping image generation method.

A scanning electron microscope that includes an X-ray analyzer has been known (see JP-A-2003-007245, for example). When acquiring an elemental map using an energy-dispersive X-ray spectrometer (EDS) or an electron energy-loss spectrometer (EELS) provided to an electron microscope, the X-ray integrated intensity detected by the EDS or the EELS signal can be enhanced by scanning an identical area of a specimen with electron beams for a long time or repeatedly.

If an identical area of the specimen is scanned with electron beams for a long time or repeatedly, the specimen is damaged by the electron beams, and changes in state. Therefore, an elemental map based on the specimen that has deteriorated is acquired (i.e., an accurate elemental map cannot be acquired). In particular, since deterioration in the specimen due to application of electron beams easily occurs at an atomic resolution level, it is difficult to acquire an accurate elemental map.

SUMMARY

Several aspects of the invention may provide an electron microscope and an elemental mapping image generation method that can acquire (obtain) an accurate elemental map while suppressing deterioration in a specimen.

According to a first aspect of the invention, there is provided an electron microscope including:

an acquisition section that acquires an electron microscope image of a specimen that includes a plurality of identical patterns, and a spectrum at each pixel of the electron microscope image; and an elemental map generation section that adds up the spectrum at each pixel of each of a plurality of areas that are included in the electron microscope image and have an identical size (i.e., adds up the spectra of a plurality of areas that are included in the electron microscope image and have an identical size on a pixel basis) to generate an elemental mapping image of the specimen.

According to a second aspect of the invention, there is provided an elemental mapping image generation method including:

an acquisition step that acquires an electron microscope image of a specimen that includes a plurality of identical patterns, and a spectrum at each pixel of the electron microscope image; and an elemental map generation step that adds up the spectrum at each pixel of each of a plurality of areas that are included in the electron microscope image and have an identical size (i.e., adds up the spectra of a plurality of areas that are included in the electron microscope image and have an identical size on a pixel basis) to generate an elemental mapping image of the specimen.

According to a third aspect of the invention, there is provided an electron microscope including:

an acquisition section that acquires an electron microscope image of a specimen that includes a plurality of identical patterns; and an image generation section that adds up images respectively included in a plurality of areas that are included in the electron microscope image and have an identical size.

BRIEF DESCRIPTION OF THE SEVERAL VIEWS OF THE DRAWING

FIG. 3 illustrates a first method according to one embodiment of the invention.

FIGS. 4A to 4C illustrate the first method according to one embodiment of the invention.

FIGS. 7A to 7C illustrates a second method according to one embodiment of the invention.

Figure 1:
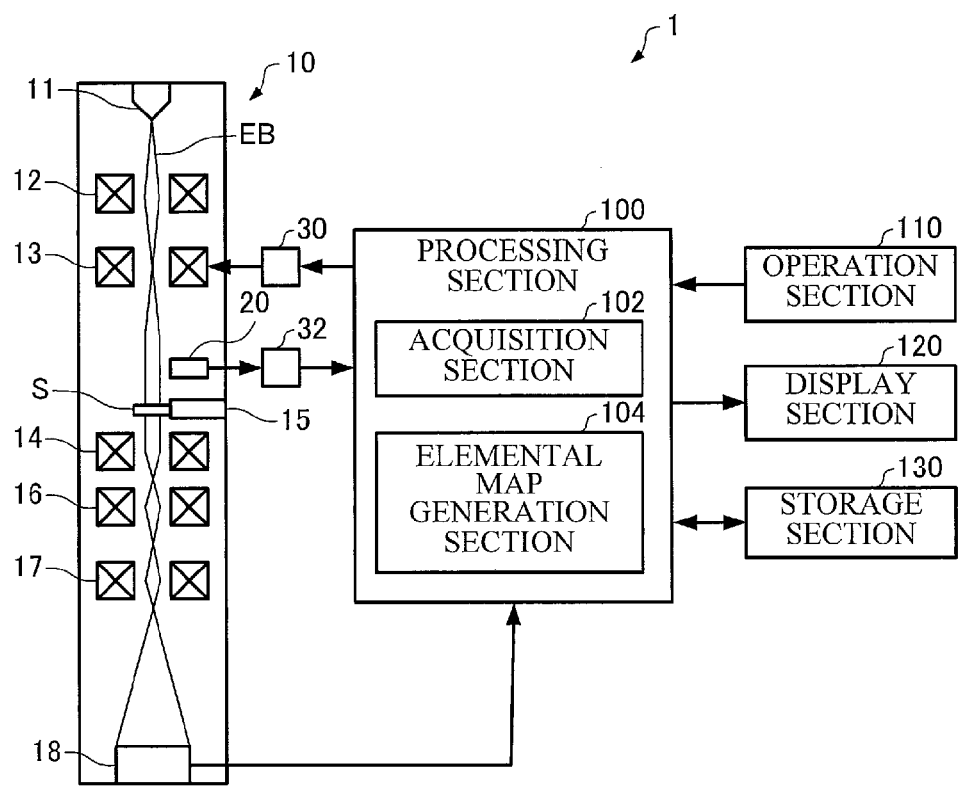
FIG. 1 is a diagram illustrating an example of the configuration of an electron microscope according to one embodiment of the invention.

DETAILED DESCRIPTION OF THE EMBODIMENT (1) According to one embodiment of the invention, an electron microscope includes:

an acquisition section that acquires an electron microscope image of a specimen that includes a plurality of identical patterns, and a spectrum at each pixel of the electron microscope image; and an elemental map generation section that adds up the spectrum at each pixel of each of a plurality of areas that are included in the electron microscope image and have an identical size to generate an elemental mapping image of the specimen.

According to another embodiment of the invention, an elemental mapping image generation method includes:

an acquisition step that acquires an electron microscope image of a specimen that includes a plurality of identical patterns, and a spectrum at each pixel of the electron microscope image; and an elemental map generation step that adds up the spectrum at each pixel of each of a plurality of areas that are included in the electron microscope image and have an identical size to generate an elemental mapping image of the specimen.

According to the above embodiments, since the spectrum at each pixel of a plurality of areas that are included in the electron microscope image and have an identical size are added up to generate the elemental mapping image of the specimen, it is possible to obtain an accurate elemental map while reducing the electron beam dose or the electron beam illumination time (measurement time).

(2) In the above electron microscope, the elemental map generation section may divide the electron microscope image into a plurality of areas having an identical size, correct a position shift in each of the plurality of areas by calculating a correlation between images respectively included in the plurality of areas, and add up the spectrum at each pixel of each of the plurality of areas for which the position shift has been corrected to generate the elemental mapping image.

In the above elemental mapping image generation method, the elemental map generation step may divide the electron microscope image into a plurality of areas having an identical size, correct a position shift in each of the plurality of areas by calculating a correlation between images respectively included in the plurality of areas, and add up the spectrum at each pixel of each of the plurality of areas for which the position shift has been corrected to generate the elemental mapping image.

According to the above embodiments, since the electron microscope image is divided into a plurality of areas having an identical size, and the spectrum at each pixel of each of the plurality of areas for which the position shift has been corrected is added up to generate the elemental mapping image, it is possible to obtain an accurate elemental map while reducing the electron beam dose or the electron beam illumination time.

(3) In the above electron microscope, the elemental map generation section may extract an area that is used as a reference from the electron microscope image, extract a plurality of areas that have a pattern and a size identical to those of the area that is used as the reference and do not overlap each other from the electron microscope image, and add up the spectrum at each pixel of each of the plurality of areas that have been extracted to generate the elemental mapping image.

In the above elemental mapping image generation method, the elemental map generation step may extract an area that is used as a reference from the electron microscope image, extract a plurality of areas that have a pattern and a size identical to those of the area that is used as the reference and do not overlap each other from the electron microscope image, and add up the spectrum at each pixel of each of the plurality of areas that have been extracted to generate the elemental mapping image.

According to the above embodiments, since a plurality of areas that have an identical pattern and an identical size and do not overlap each other are extracted from the electron microscope image, and the spectrum at each pixel of each of the plurality of areas is added up to generate the elemental mapping image, it is possible to obtain an accurate elemental map while reducing the electron beam dose or the electron beam illumination time.

(4) In the above electron microscope, the elemental map generation section may determine the periodicity of the pattern included in the electron microscope image, divide the electron microscope image into a plurality of areas having an identical size based on the determination results, and add up the spectrum at each pixel of each of the plurality of areas obtained by dividing the electron microscope image to generate the elemental mapping image.

In the above elemental mapping image generation method, the elemental map generation step may determine the periodicity of the pattern included in the electron microscope image, divide the electron microscope image into a plurality of areas having an identical size based on the determination results, and add up the spectrum at each pixel of each of the plurality of areas obtained by dividing the electron microscope image to generate the elemental mapping image.

According to the above embodiments, since the periodicity of the pattern included in the electron microscope image is determined, the electron microscope image is divided into a plurality of areas having an identical size based on the determination results, and the spectrum at each pixel of each of the plurality of areas obtained by dividing the electron microscope image is added up to generate the elemental mapping image, it is possible to obtain an accurate elemental map while reducing the electron beam dose or the electron beam illumination time.

(5) According to another embodiment of the invention, an electron microscope includes:

an acquisition section that acquires an electron microscope image of a specimen that includes a plurality of identical patterns; and an image generation section that adds up images respectively included in a plurality of areas that are included in the electron microscope image and have an identical size.

According to the above embodiment, since the images respectively included in a plurality of areas that are included in the electron microscope image (of a specimen that includes a plurality of identical patterns) and have an identical size are added up, it is possible to obtain an accurate elemental map while reducing the electron beam dose or the electron beam illumination time (measurement time).

Exemplary embodiments of the invention are described in detail below with reference to the drawings. Note that the following exemplary embodiments do not unduly limit the scope of the invention as stated in the claims. Note also that all of the elements described below should not necessarily be taken as essential elements of the invention.

1. Configuration

FIG. 1 is a diagram illustrating the configuration of an electron microscope according to one embodiment of the invention. An example in which the electron microscope has the configuration of a scanning transmission electron microscope (STEM) is described below. Note that the electron microscope may have the configuration of a scanning electron microscope (SEM). The electron microscope according to one embodiment of the invention may have a configuration in which some of the elements (sections) illustrated in FIG. 1 are omitted.

As illustrated in FIG. 1, an electron microscope 1 includes an electron microscope main body 10, a processing section 100, an operation section 110, a display section 120, and a storage section 130.

The electron microscope main body 10 includes an electron beam source 11, a condenser lens 12, a scanning deflector 13, an objective lens 14, a specimen stage 15, an intermediate lens 16, a projection lens 17, a transmission electron detector 18, an EDS detector 20, a deflector control device 30, and a multi-channel pulse-height analyzer 32.

The electron beam source 11 generates electron beams EB. The electron beam source 11 accelerates electrons released from a cathode using an anode to emit the electron beams EB. An electron gun may be used as the electron beam source 11, for example.

The condenser lens 12 is disposed in the subsequent stage of the electron beam source 11 (on the downstream side of the electron beam source 11 (that emits the electron beams EB)). The condenser lens 12 focuses the electron beams EB generated by (emitted from) the electron beam source 11, and applies the electron beams EB to a specimen S. The condenser lens 12 may include a plurality of lenses.

The scanning deflector 13 is disposed in the subsequent stage of the condenser lens 12. The scanning deflector 13 deflects the electron beams EB, and scans the specimen S with the electron beams EB (electron probe) focused by the condenser lens 12 and the objective lens 14. The scanning deflector 13 includes a deflection coil that deflects the electron beams EB. The scanning deflector 13 is controlled by the deflector control device 30. The deflector control device 30 controls the scanning deflector 13 based on a scan signal generated by the processing section 100.

The objective lens 14 is disposed in the subsequent stage of the scanning deflector 13 (scanning coil). The objective lens 14 focuses the electron beams EB to apply the electron beams EB to the specimen S.

The specimen stage 15 holds the specimen S. The specimen stage 15 holds the specimen S via a specimen holder (not illustrated in FIG. 1). The specimen stage 15 positions the specimen S by moving and stopping the specimen holder. The specimen stage 15 is controlled by a stage control device (not illustrated in FIG. 1), and can move the specimen S in the lateral direction (i.e., the direction orthogonal to the travel direction of the electron beams EB) and the longitudinal direction (i.e., the direction along the travel direction of the electron beams EB).

The intermediate lens 16 is disposed in the subsequent stage of the objective lens 14. The projection lens 17 is disposed in the subsequent stage of the intermediate lens 16. The intermediate lens 16 and the projection lens 17 guide the electron beams EB that have passed through the specimen S toward the transmission electron detector 18. For example, the intermediate lens 16 and the projection lens 17 form an image on the transmission electron detector 18 by projecting the image plane of the objective lens 14 or the back focal plane (i.e., a plane in which a diffraction pattern is formed).

The transmission electron detector 18 is disposed in the subsequent stage of the projection lens 17. The transmission electron detector 18 detects electrons that have passed through the specimen S.

The EDS detector 20 detects characteristic X-rays generated from the specimen S upon application of the electron beams EB. A silicon-drift detector (SDD), an Si(Li) detector, or the like may be used as the EDS detector 20, for example. An output signal (output pulse) from the EDS detector 20 is transmitted to the multi-channel pulse-height analyzer 32.

The multi-channel pulse-height analyzer (multi-channel analyzer) 32 is a pulse-height analyzer having a plurality of channels. The multi-channel pulse-height analyzer 32 counts the output signal (output pulse) from the EDS detector 20 corresponding to each X-ray energy to generate EDS spectral information. The multi-channel pulse-height analyzer 32 outputs the EDS spectral information to the processing section 100.

The operation section 110 allows the user to input operation information, and outputs the input operation information to the processing section 100. The function of the operation section 110 may be implemented by hardware such as a keyboard, a mouse, a button, or a touch panel.

The display section 120 displays an image generated by the processing section 100. The function of the display section 120 may be implemented by an LCD, a CRT, or the like.

The storage section 130 stores a program that causes a computer to function as each section of the processing section 100, and also stores various types of data. The storage section 130 serves as a work area for the processing section 100. The function of the storage section 130 may be implemented by a hard disk, a RAM, or the like.

The processing section 100 performs a process that controls the deflector control device 30, the stage control device, and the like, a process that acquires a scanning transmission electron microscope image and the EDS spectral information, a process that generates an elemental mapping image, and the like. The function of the processing section 100 may be implemented by hardware such as a processor (e.g., CPU or DSP), or a program. The processing section 100 includes an acquisition section 102 and an elemental map generation section 104.

The acquisition section 102 visualizes a detection signal output from the transmission electron detector 18 in synchronization with the scan signal to acquire an electron microscope image (scanning transmission electron microscope image). The acquisition section 102 acquires the spectrum (EDS spectrum) at each pixel of the electron microscope image (i.e., the area scanned with the electron beams EB) based on the EDS spectral information output from the multi-channel pulse-height analyzer 32 and the scan signal.

The elemental map generation section 104 generates an elemental mapping image in which the integrated intensity within a specific energy range (ROI) is mapped, based on the spectrum at each pixel that has been acquired by the acquisition section 102. The elemental map generation section 104 according to one embodiment of the invention adds up the spectrum at each pixel of each of a plurality of areas (that have an identical size and do not overlap each other) included in the electron microscope image, and generates an elemental mapping image (in which the X-ray integrated intensity is mapped on a pixel basis) based on the spectrum at each pixel calculated by the addition process.

The elemental map generation section 104 may divide the electron microscope image into a plurality of areas having an identical size, correct a position shift in each of the plurality of areas by calculating the correlation between the images respectively included in the plurality of areas, and add up the spectrum at each pixel of each of the plurality of areas for which the position shift has been corrected to generate the elemental mapping image.

The elemental map generation section 104 may extract an area that is used as a reference from the electron microscope image, extract a plurality of areas that have a pattern and a size identical to those of the area that is used as the reference and do not overlap each other from the electron microscope image, and add up the spectrum at each pixel of each of the plurality of areas that have been extracted to generate the elemental mapping image.

The elemental map generation section 104 may determine the periodicity of the pattern included in the electron microscope image, divide the electron microscope image into a plurality of areas having an identical size based on the determination results (i.e., automatically determine the number of areas into which the electron microscope image is divided, the size of each area, and the position of each area based on the determination results), and add up the spectrum at each pixel of each of the plurality of areas obtained by dividing the electron microscope image to generate the elemental mapping image.

2. Method

An elemental mapping image generation method according to one embodiment of the invention is described below with reference to the drawings.

Figure 2A:
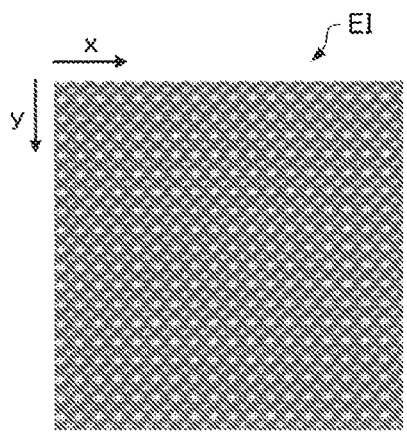
FIG. 2A illustrates an example of an electron microscope image acquired by an electron microscope according to one embodiment of the invention, FIG. 2B schematically illustrates the spectrum at each pixel of the acquired electron microscope image.
Figure 2B:
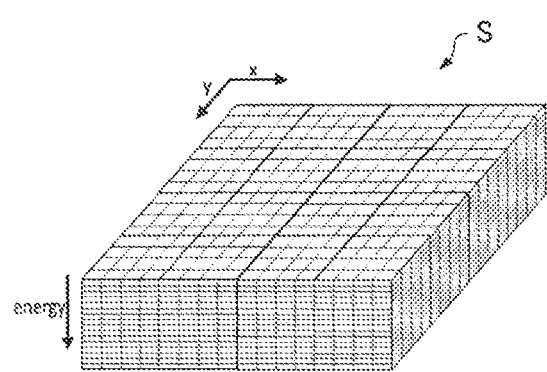
FIG. 2C illustrates an example of an elemental mapping image generated from the spectrum at each pixel.

FIG. 2A illustrates an example of an electron microscope image acquired by the electron microscope 1 according to one embodiment of the invention. FIG. 2B schematically illustrates the spectrum at each pixel of the acquired electron microscope image, and FIG. 2C illustrates an example of an elemental mapping image generated from the spectrum at each pixel.

The electron microscope image EI illustrated in FIG. 2A is a scanning transmission electron microscope image of strontium titanate ($SrTiO_3$) in which the atoms are periodically arranged (i.e., periodic structure). The elemental mapping image. MI illustrated in FIG. 2C is an elemental mapping image of strontium in which the atoms are periodically arranged (i.e., periodic structure).

Figure 2C:
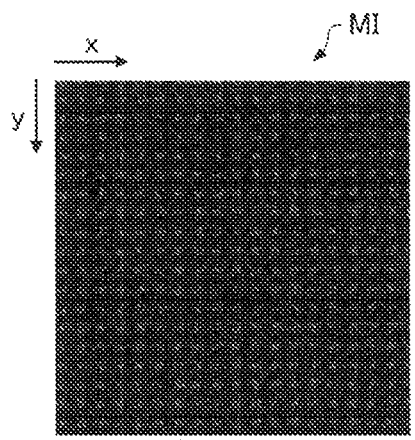

When a periodic structure (i.e., a plurality of identical patterns) as illustrated in FIGS. 2A and 2C is present within the observation field of view (electron microscope image or elemental mapping image), a plurality of images obtained by appropriately dividing the elemental mapping image into a plurality of areas having an identical size are identical to each other. The elemental mapping image generation method according to one embodiment of the invention divides an elemental mapping image into a plurality of areas having an identical size in view of such periodicity to obtain a plurality of images, and synthesizes (blends) the plurality of images into a single image to generate an elemental mapping image. This makes it possible to obtain an accurate elemental map by increasing the signal strength while reducing the electron beam dose or the electron beam illumination time.

2-1. First Method

A first method according to one embodiment of the invention divides an electron microscope image into a plurality of areas, performs a position shift correction process on the plurality of areas, and performs an addition process that adds up the spectrum at each pixel of each of the plurality of areas subjected to the position shift correction process to generate an elemental mapping image.

Specifically, the electron microscope image is divided (at equal intervals) into a plurality of areas having an identical size. In the example illustrated in FIG. 3, the electron microscope image EI is divided into sixteen areas. Note that the electron microscope image may be divided into an arbitrary number of areas. The areas $A_1$ to $A_{16}$ obtained by dividing the electron microscope image have an identical size and do not overlap each other. Each of the areas $A_1$ to $A_{16}$ includes one or more periodic structures (patterns). Since the first method divides the electron microscope image without taking account of the pattern periodicity, the areas $A_1$ to $A_{16}$ obtained by dividing the electron microscope image may differ in the phase of the periodic pattern.

One area among the plurality of areas obtained by dividing the electron microscope image is set to be a reference area. For example, the area $A_1$ is set to be the reference area. The cross-correlation between the image included in the reference area $A_1$ and the image included in the area $A_n$ (n=2, 3, 4, . . . ) other than the reference area is calculated, and the position shift amount ($\Delta x_n$, $\Delta y_n$) between the reference area $A_1$ and the area $A_n$ is calculated. Note that Axe is the position shift amount (phase shift amount) in the x-axis direction (lateral direction), and $\Delta y_n$ is the position shift amount in the y-axis direction (longitudinal direction). FIG. 4A illustrates an example of the calculated position shift amount between the reference area $A_1$ and each area $A_n$.

The position coordinates of each area $A_n$ are corrected based on the position shift amount ($\Delta x_n$, $\Delta y_n$) between the reference area $A_1$ and each area $A_n$. Specifically, the position of the origin of each area $A_n$ is shifted based on the position shift amount to obtain a corrected area $A_n$' having the same size (w, h) as that of the original area $A_n$. The corrected coordinates ($x_{new}$, $y_{new}$) are calculated using the following expressions (where, ($x_{old}$, $y_{old}$) are the uncorrected coordinates).

$$x_{new} = x_{old} + \Delta x_n$$

$$y_{new} = y_{old} + \Delta y_n$$

In the example illustrated in FIG. 4A, the coordinates of the origin SP of the area $A_2$ are shifted by +1 in the x-axis direction and shifted by +1 in the y-axis direction to obtain an area $A_2$', the coordinates of the origin SP of the area $A_3$ are shifted by +1 in the y-axis direction to obtain an area $A_3$', and the coordinates of the origin SP of the area $A_{16}$ are shifted by −1 in the x-axis direction and shifted by +1 in the y-axis direction to obtain an area $A_{16}$' (see FIG. 4B).

The spectrum $S_1$ at each pixel (coordinates) of the reference area $A_1$ and the spectrum $S_n$' at each pixel of each area $A_n$' are added up on a pixel (coordinate) basis (see FIG. 4C), and an elemental mapping image is generated based on the spectrum at each pixel calculated by the addition process. When the position shift correction process is performed on the area $A_n$, the spectral information may be absent at some of the coordinates within the corrected area $A_n$' (e.g., the coordinates within the area $A_2$', the area $A_3$', and the area $A_{16}$' that are hatched in FIG. 4C). The addition process is performed provided that the intensity value of the spectrum that corresponds to each energy is 0 at these coordinates. Note that the spectral information that has been included within the area $A_n$, but is no longer included within the corrected area $A_n$' obtained by performing the position shift correction process on the area $A_n$ is discarded.

Figure 5A:
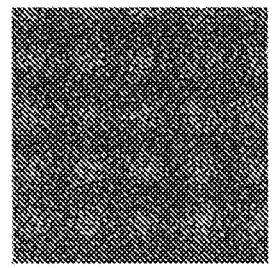
FIG. 5A illustrates an elemental mapping image within a reference area.
Figure 5B:
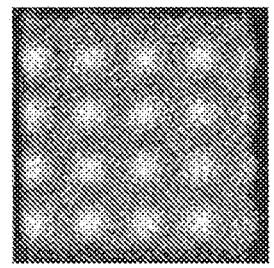
FIG. 5B illustrates an elemental mapping image generated through an addition process.
Figure 5C:
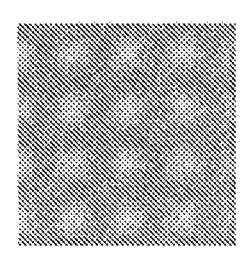
FIG. 5C illustrates an image obtained by trimming the peripheral area of an elemental mapping image generated through an addition process.

FIG. 5A illustrates the elemental mapping image within the reference area $A_1$ before the addition process is performed, and FIG. 5B illustrates the elemental mapping image generated through the addition process. As illustrated in FIGS. 5A and 5B, the elemental mapping image generated through the addition process has improved accuracy due to an increase in the signal level as compared with the elemental mapping image before the addition process is performed. Since the spectral information is absent at some of the coordinates due to the position shift correction process performed on each area (see above), the peripheral area of the elemental mapping image generated through the addition process is attenuated. Therefore, the peripheral area of the elemental mapping image generated through the addition process may be trimmed to generate the final elemental mapping image (see FIG. 5C).

Figure 6A:
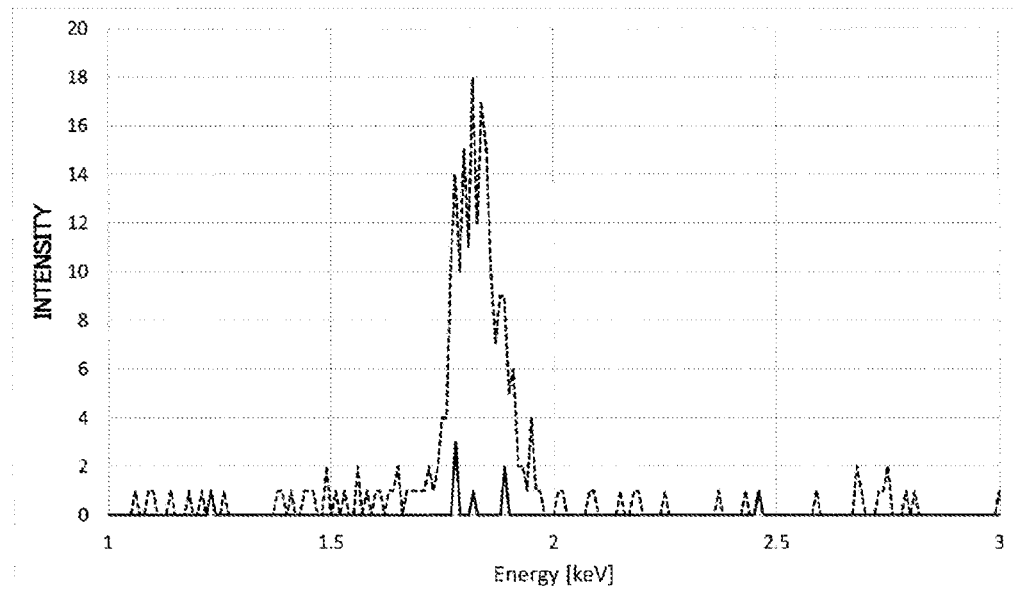
FIG. 6A is a graph illustrating the spectrum at one pixel of a reference area, and the spectrum at the corresponding pixel after an addition process has been performed.
Figure 6B:
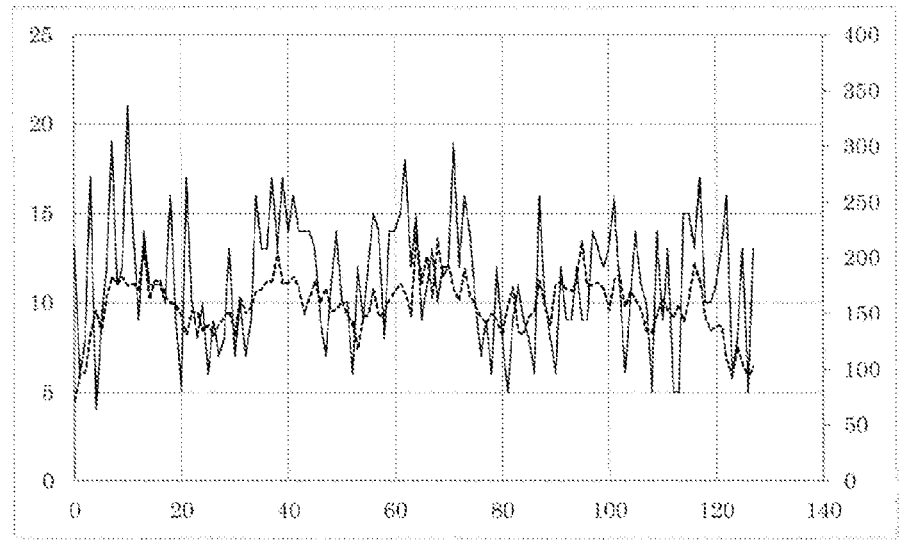
FIG. 6B is a graph illustrating the intensity that corresponds to one line in the lateral direction within an elemental mapping image within a reference area $A_1$, and the intensity that corresponds to the corresponding line within an elemental mapping image generated through the addition process.

FIG. 6A illustrates the spectrum at one pixel within the reference area $A_1$ before the addition process is performed (see the solid lines), and the spectrum at the corresponding pixel after the addition process has been performed (see the broken lines). FIG. 6B illustrates the intensity (line profile) that corresponds to one line in the lateral direction within the elemental mapping image within the reference area $A_1$ before the addition process is performed (see the solid line), and the intensity that corresponds to the corresponding line within the elemental mapping image generated through the addition process (see the broken line). In FIG. 6B, the left vertical axis indicates the intensity before the addition process is performed, the right vertical axis indicates the intensity after the addition process has been performed, and the horizontal axis indicates the coordinates (pixel) in the lateral direction. As illustrated in FIGS. 6A and 6B, the intensity after the addition process has been performed is higher than the intensity before the addition process is performed by a factor of about 16 (as a result of the addition process performed on the sixteen areas), and a variation due to a statistical error is reduced by ¼ (i.e., accuracy is improved).

2-2. Second Method

A second method according to one embodiment of the invention extracts a plurality of areas that have an identical pattern and an identical size and do not overlap each other from an electron microscope image, and performs an addition process that adds up the spectrum at each pixel of each of the plurality of areas (that have been extracted) to generate an elemental mapping image.

Specifically, an area that is used as a reference (reference area) is set to (within) the electron microscope image. In the example illustrated in FIG. 7A, a reference area $A_1$ is set at the upper left corner of the electron microscope image EI.

An area $A_n$ (n=2, 3, 4, . . . ) that includes an image having a high degree of similarity with the image included in the reference area $A_1$ is extracted from the electron microscope image. The reference area $A_1$ and the area $A_n$ have an identical size and do not overlap each other. Each area includes one or more periodic structures (patterns). In the example illustrated in FIG. 7B, areas $A_2$ to $A_9$ have been extracted from the electron microscope image EI as an area that has a high degree of similarity with the reference area $A_1$.

When extracting the area $A_n$, a normalized cross-correlation function with the entire electron microscope image EI is calculated using the image within the reference area $A_1$ as a template image. FIG. 7C illustrates the calculation result image. The calculation result image is then searched for the maximum value (i.e., a position at which the degree of similarity is high) of the normalized cross-correlation function from the vicinity of the reference area $A_1$. In the image illustrated in FIG. 7C, each white area having high brightness represents a position at which the degree of similarity is high. An area having the same size as that of the reference area $A_1$ is set at the position that corresponds to the maximum value that has been found. In this case, the area is set so that the upper left corner of the area coincides with the position that corresponds to the maximum value. When the area that has been set at the position that corresponds to the maximum value does not overlap an area that has already been set to be the extracted area, the area that has been set at the position that corresponds to the maximum value is set to be the extracted area (area $A_n$), and the calculation result image is further searched for the maximum value. When the area that has been set at the position that corresponds to the maximum value overlaps an area that has already been set to be the extracted area, the area that has been set at the position that corresponds to the maximum value is not set to be the extracted area, and the calculation result image is further searched for the maximum value. The extracted area is repeatedly set until the entire calculation result image is searched for the maximum value.

Figure 8:
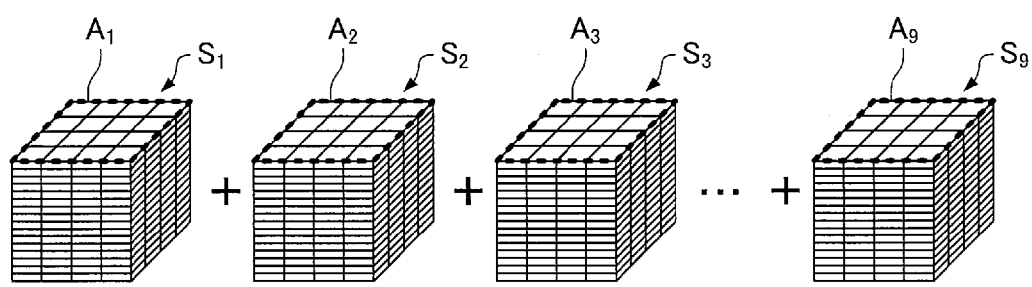
FIG. 8 illustrates the second method according to one embodiment of the invention.

The spectrum $S_1$ at each pixel of the reference area $A_1$ and the spectrum $S_n$ at each pixel of each extracted area $A_n$ are added up on a pixel (coordinate) basis (see FIG. 8), and an elemental mapping image is generated based on the spectrum at each pixel calculated by the addition process.

According to the second method, the number of areas subjected to the addition process is smaller than that when using the first method (when the size of each area is identical). However, since it is unnecessary to perform the position shift correction process on the area $A_n$, attenuation does not occur in the peripheral area of the elemental mapping image generated through the addition process, and a high signal level can be obtained over the entire elemental mapping image generated through the addition process.

Figure 9:
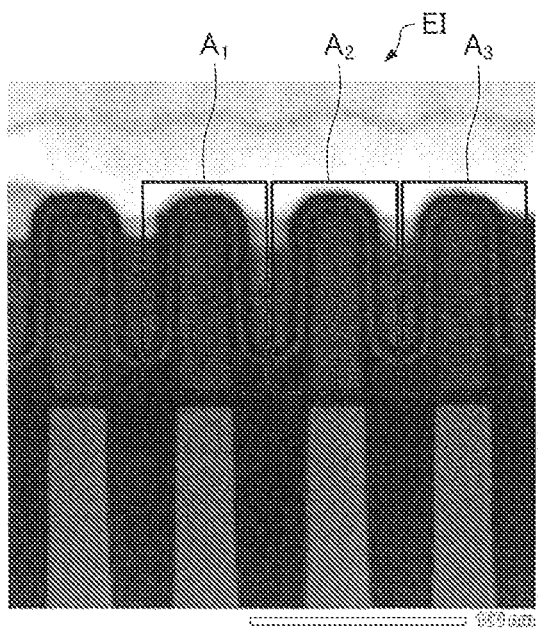
FIG. 9 illustrates the second method according to one embodiment of the invention.

Note that the second method may also be applied to the case of acquiring an elemental map of a specimen (e.g., semiconductor specimen) that has a plurality of identical patterns in addition to the case of acquiring an elemental map of a specimen in which the atoms are periodically arranged. The electron microscope image EI illustrated in FIG. 9 is an electron microscope image of a semiconductor specimen in which a plurality of identical patterns are present. In the example illustrated in FIG. 9, the reference area $A_1$ has been set to one of the plurality of identical patterns within the electron microscope image EI, and two areas $A_2$ and $A_3$ that include an image having a high degree of similarity with the image included in the reference area $A_1$ (i.e., the same pattern as the pattern to which the reference area $A_1$ has been set) have been extracted. In this case, an accurate elemental map of the pattern included in the semiconductor specimen can be obtained by adding up the spectrum at each pixel within the reference area $A_1$ and the spectrum at each pixel within the extracted areas $A_2$ and $A_3$.

2-3. Third Method

A third method according to one embodiment of the invention determines the periodicity of a pattern (structure) included in an electron microscope image, divides the electron microscope image into a plurality of areas based on the determination results, and performs an addition process that adds up the spectrum at each pixel of each of the plurality of areas (obtained by dividing the electron microscope image) to generate an elemental mapping image.

Figure 10:
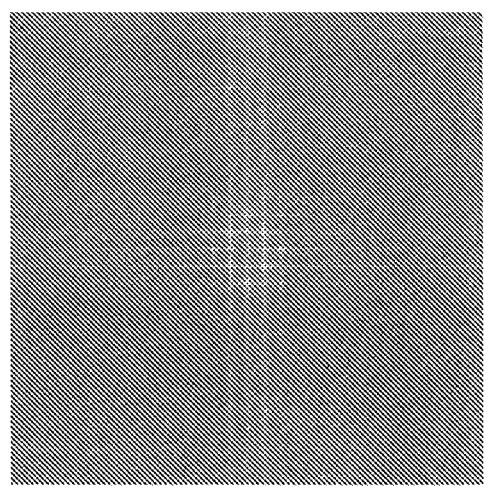
FIG. 10 illustrates a third method according to one embodiment of the invention.

Specifically, the electron microscope image is subjected to a Fourier transform to obtain a Fourier-transformed image. FIG. 10 illustrates an example of the Fourier-transformed image obtained from the electron microscope image. The periodicity ($f_x$, $f_y$) is calculated from the Fourier-transformed image using a known technique. Note that $f_x$ is the periodicity of the periodic structure included in the electron microscope image in the lateral direction, and $f_y$ is the periodicity of the periodic structure included in the electron microscope image in the longitudinal direction.

The periodicity ($m_x$, $m_y$) of the periodic structure included in one area (extracted area) (obtained by dividing the electron microscope image) is calculated from the periodicity ($f_x$, $f_y$). Note that $m_x$ is the periodicity in the lateral direction, and $m_y$ is the periodicity in the longitudinal direction. The user may set the periodicity ($m_x$, $m_y$), or a preset value may be used as the periodicity ($m_x$, $m_y$). The size (W, H) of each area obtained by dividing the electron microscope image is calculated from the periodicity ($f_x$, $f_y$) and the periodicity ($m_x$, $m_y$) using the following expressions.

$$W = \text{width} \times m_x / f_x$$

$$H = \text{height} \times m_y / f_y$$

Note that "width" is the size of the electron microscope image in the lateral direction, and "height" is the size of the electron microscope image in the longitudinal direction.

The position ($P_n$, $P_m$) of each area obtained by dividing the electron microscope image is calculated from the size (W, H) of each area. Note that $P_n$ (n=0, 1, 2, . . . ) is the x-coordinate of the upper left corner of the nth area in the lateral direction, and $P_m$ (m=0, 1, 2, . . . ) is the y-coordinate of the upper left corner of the mth area in the longitudinal direction. Specifically, the position ($P_n$, $P_m$) represents the coordinates of the upper left corner of the area $A_{(n,m)}$ that is the nth area in the lateral direction and is the mth area in the longitudinal direction. The position ($P_n$, $P_m$) of each area is calculated using the following expressions.

$$P_n = W \times n + \text{offset\_x}$$

$$P_m = H \times m + \text{offset\_y}$$

Figure 11:
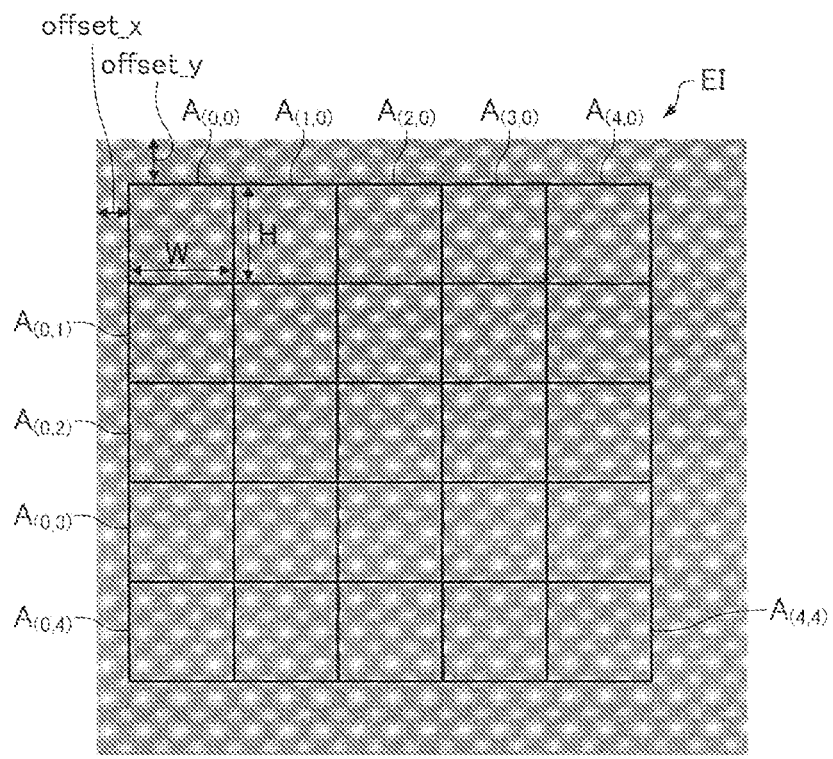
FIG. 11 illustrates the third method according to one embodiment of the invention.

Note that offset_x is the offset value in the lateral direction, and offset_y is the offset value in the longitudinal direction (see FIG. 11). In the example illustrated in FIG. 11, the electron microscope image EI for which the periodicity has been determined has been divided into twenty-five (5×5) areas $A_{(0,0)}$ to $A_{(4,4)}$.

The spectrum at each pixel of each area $A_{(n,m)}$ is added up on a pixel (coordinate) basis, and an elemental mapping image is generated based on the spectrum at each pixel calculated by the addition process.

According to the third method, since it is unnecessary to perform the position shift correction process on each area (obtained by dividing the electron microscope image) in the same manner as the second method, attenuation does not occur in the peripheral area of the elemental mapping image generated through the addition process, and a high signal level can be obtained over the entire elemental mapping image generated through the addition process.

3. Modifications

The invention is not limited to the above embodiments. Various modifications and variations may be made of the above embodiments. The invention includes various other configurations substantially the same as the configurations described in connection with the above embodiments (e.g., a configuration having the same function, method, and results, or a configuration having the same objective and effects). The invention also includes a configuration in which an unsubstantial section (element) described in connection with the above embodiments is replaced with another section (element). The invention also includes a configuration having the same effects as those of the configurations described in connection with the above embodiments, or a configuration capable of achieving the same objective as that of the configurations described in connection with the above embodiments. The invention further includes a configuration in which a known technique is added to the configurations described in connection with the above embodiments.

Although the above embodiments have been described taking an example in which the electron microscope includes an EDS detector, the invention may also be applied to an electron microscope that includes an EELS detector. In this case, the acquisition section 102 acquires the EELS spectrum (electron energy-loss spectrum) at each pixel of the electron microscope image instead of acquiring the EDS spectrum (X-ray spectrum) at each pixel of the electron microscope image.

Figure 12:
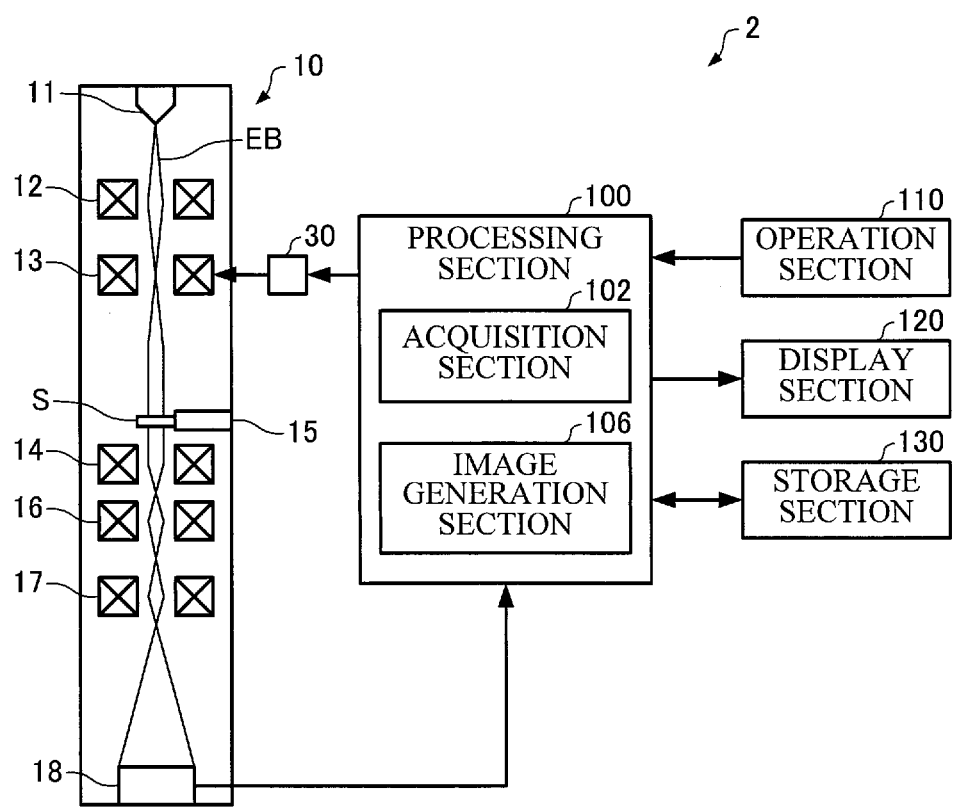
FIG. 12 is a diagram illustrating an example of the configuration of an electron microscope according to one embodiment of the invention.

Although the above embodiments have been described taking an example in which the spectrum at each pixel of a plurality of areas that are included in an electron microscope image and have an identical size are added up to generate an elemental mapping image, the images respectively included in a plurality of areas (i.e., each pixel value of a plurality of areas) that are included in an electron microscope image and have an identical size may be added up. FIG. 12 illustrates an example of the configuration of an electron microscope that implements such a modification. In FIG. 12, the same elements as those illustrated in FIG. 1 are indicated by the same reference signs (symbols), and descriptions thereof are appropriately omitted. An electron microscope 2 illustrated in FIG. 12 has the configuration of a scanning transmission electron microscope (STEM). Note that the electron microscope 2 may have the configuration of a scanning electron microscope (SEM), or may have the configuration of a transmission electron microscope (TEM).

The electron microscope 2 illustrated in FIG. 12 does not include the EDS detector 20 and the multi-channel pulse-height analyzer 32, differing from the electron microscope 1 illustrated in FIG. 1. The processing section 100 included in the electron microscope 2 includes an image generation section 106 instead of the elemental map generation section 104. The image generation section 106 performs an addition process that adds up (or adds up and averages) the images respectively included in a plurality of areas (that have an identical size and do not overlap each other) included in the electron microscope image (i.e., an electron microscope image of a specimen that includes a plurality of identical patterns) that has been acquired by the acquisition section 102.

The image generation section 106 may divide the electron microscope image into a plurality of areas having an identical size, perform a position shift correction process that corrects the position shift in each of the plurality of areas by calculating the correlation between the images respectively included in the plurality of areas, and perform the addition process that adds up the images respectively included in the plurality of areas for which the position shift has been corrected. More specifically, one of the plurality of areas obtained by dividing the electron microscope image is set to be the reference area A1, the cross-correlation between the image included in the reference area $A_1$ and the image included in the area $A_n$ (n=2, 3, 4, . . . ) other than the reference area is calculated, and the position shift amount ($\Delta x_n$, $\Delta y_n$) between the reference area $A_1$ and the area $A_n$ is calculated (see the first method). The position coordinates of each area $A_n$ are corrected based on the position shift amount ($\Delta x_n$, $\Delta y_n$) between the reference area $A_1$ and each area $A_n$, and the image included in the reference area $A_1$ and the image included in each corrected area $A_n'$ are added up (integrated). The images may be added up, and then averaged (i.e., divided by the number of areas obtained by dividing the electron microscope image). When the position shift correction process is performed on the area $A_n$, the pixel value (brightness value) may be absent at some of the coordinates within the corrected area $A_n'$. The addition process is performed provided that the pixel value is 0 at these coordinates. The pixel value that has been included within the area $A_n$, but is no longer included within the corrected area $A_n'$ obtained by performing the position shift correction process on the area $A_n$ is discarded. Since the peripheral area of the image (addition image) obtained by the addition process is attenuated, the peripheral area of the addition image may be trimmed to generate the final addition image.

The image generation section 106 may extract an area (reference area) that is used as a reference from the electron microscope image, extract a plurality of areas that have a pattern and a size identical to those of the area that is used as the reference and do not overlap each other from the electron microscope image, and add up the images respectively included in the plurality of areas that have been extracted. More specifically, a normalized cross-correlation function with the entire electron microscope image is calculated using the image within the reference area $A_1$ as a template image, the calculation result image is searched for the maximum value (i.e., a position at which the degree of similarity is high) of the normalized cross-correlation function from the vicinity of the reference area $A_1$, and an area having the same size as that of the reference area $A_1$ is set at the position that corresponds to the maximum value that has been found (see the second method). When the area that has been set at the position that corresponds to the maximum value does not overlap an area that has already been set to be the extracted area, the area that has been set at the position that corresponds to the maximum value is set to be the extracted area (area $A_n$), and the calculation result image is further searched for the maximum value. The extracted area is repeatedly set until the entire calculation result image is searched for the maximum value. The image included in the reference area $A_1$ and the image included in each extracted area $A_n$ are added up (integrated). The images may be added up, and then averaged.

The image generation section 106 may determine the periodicity of the pattern included in the electron microscope image, divide the electron microscope image into a plurality of areas having an identical size based on the determination results (i.e., automatically determine the number of areas into which the electron microscope image is divided, the size of each area, and the position of each area based on the determination results), and add up the images respectively included in the plurality of areas obtained by dividing the electron microscope image. More specifically, the electron microscope image is subjected to a Fourier transform to obtain a Fourier-transformed image, the periodicity $(f_x, f_y)$ is calculated from the Fourier-transformed image, the periodicity $(m_x, m_y)$ of the periodic structure included in one area (extracted area) (obtained by dividing the electron microscope image) is calculated (or set) from the periodicity $(f_x, f_y)$. The size (W, H) of each area obtained by dividing the electron microscope image is calculated from the periodicity $(f_x, f_y)$ and the periodicity $(m_x, m_y)$, and the position $(P_n, P_m)$ of each area obtained by dividing the electron microscope image is calculated from the size (W, H) of each area. The image included in each area is then added up (integrated). The images may be added up, and then averaged.

When the specimen includes a plurality of identical patterns (e.g., periodic structure), and the images respectively included in a plurality of areas that are included in the electron microscope image of the specimen and have an identical size are added up as described above, it is possible to obtain an accurate image (e.g., an image of the periodic structure included in the specimen) while suppressing deterioration in the specimen due to application of electron beams, and reducing the electron beam dose or the electron beam illumination time. In particular, since electron beams are concentrated on a narrow area of the specimen when atomic-level observation is performed using a transmission electron microscope, it is important to limit the electron beam dose or the electron beam illumination time.

Although only some embodiments of the invention have been described in detail above, those skilled in the art would readily appreciate that many modifications are possible in the embodiments without materially departing from the novel teachings and advantages of the invention. Accordingly, all such modifications are intended to be included within the scope of the invention.

What is claimed is:

1. An electron microscope comprising:
a main body including an electron beam source, deflectors for scanning the electron beam across a two-dimensional surface of a specimen, and detectors for detecting signals emitted from the specimen in response to the scanned beam;
a processor executing a program stored on a hard disk or in RAM such that it stores the signals from the detectors as data representing an electron microscope image of the specimen that includes a plurality of identical patterns, and spectrum data of the specimen corresponding to pixels of the electron microscope image,
and such that it extracts from the electron image a plurality of small-area images, each small-area image being identical in size, and having the identical pattern, and such that it reads the spectrum corresponding to pixels of the extracted small-area images and adds up the spectrum at each pixel of the small-area images on a corresponding pixel basis to generate an elemental mapping image of the specimen that corresponds to each of the small-area images.

2. The electron microscope as defined in claim 1, wherein the processor executing the stored program divides the electron microscope image into a plurality of small areas having an identical size, corrects a position shift in each of a plurality of small-area images of the divided small areas by calculating a correlation between the small-area images, and adds up the spectrum at each pixel of the small-area images for which the position shift has been corrected on a corresponding pixel basis to generate the elemental mapping image of the specimen that corresponds to each of the small-area images.

3. The electron microscope as defined in claim 1, wherein the processor for executing the stored program sets a small reference area from the electron microscope image, extracts a plurality of small areas that have a size identical to that of the small reference area and do not overlap each other from the electron microscope image, a plurality of small-area images of the extracted small areas including patterns at positions identical to patterns included in a small-area image of the small reference area, and adds up the spectrum at each pixel of the small-area image of the small reference area and the spectrum at each pixel of the small-area images of the extracted small areas on a corresponding pixel basis to generate the elemental mapping image of the specimen that corresponds to each of the small-area images.

4. The electron microscope as defined in claim 1, wherein the processor for executing the stored program determines a periodicity of the pattern included in the electron microscope image, divides the electron microscope image into a plurality of small areas having an identical size based on determination results, and adds up the spectrum at each pixel of a plurality of small-area images of the divided small areas on a corresponding pixel basis to generate the elemental mapping image of the specimen that corresponds to each of the small-area images.

5. An elemental mapping image generation method comprising:
scanning an electron beam across a two-dimensional surface of a specimen and detecting a spectrum emitted in response to the scanned beam;
an acquisition step performed by a processor executing a stored program that acquires an electron microscope image of the specimen that includes a plurality of identical patterns, and a spectrum at each pixel of the electron microscope image; and
extracts from the electron microscope image a plurality of small-area images each of the small-area images having the identical patterns, and adds up the spectrum at each pixel of the small-area images on a corresponding pixel basis to generate an elemental mapping image of the specimen that corresponds to each of the small-area images.

\* \* \* \* \*

UNITED STATES PATENT AND TRADEMARK OFFICE
CERTIFICATE OF CORRECTION

PATENT NO. : 9,627,175 B2
APPLICATION NO. : 14/882817
DATED : April 18, 2017
INVENTOR(S) : Masaki Morita It is certified that error appears in the above-identified patent and that said Letters Patent is hereby corrected as shown below:

On the Title Page

Column 1, after item (72) Inventors: Masaki Morita, Tokyo (JP); Akira Yasuhara, Tokyo (JP) insert -- ; Akihito Kumamoto, Tokyo (JP) --

Signed and Sealed this
Sixteenth Day of March, 2021

Drew Hirshfeld
*Performing the Functions and Duties of the*
*Under Secretary of Commerce for Intellectual Property and*
*Director of the United States Patent and Trademark Office*